(12) United States Patent
Kim et al.

(10) Patent No.: US 7,514,325 B2
(45) Date of Patent: Apr. 7, 2009

(54) FIN-FET HAVING GAA STRUCTURE AND METHODS OF FABRICATING THE SAME

(75) Inventors: Suk-Pil Kim, Yongin-si (KR); Jae-Woong Hyun, Uijeongbu-si (KR); Yoon-Dong Park, Yongin-si (KR); Won-Joo Kim, Suwon-si (KR); Dong-Gun Park, Seongnam-si (KR); Choong-Ho Lee, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 201 days.

(21) Appl. No.: 11/505,936

(22) Filed: Aug. 18, 2006

(65) Prior Publication Data
US 2007/0145431 A1    Jun. 28, 2007

(30) Foreign Application Priority Data
Dec. 24, 2005    (KR)    ...................... 10-2005-0129138

(51) Int. Cl.
*H01L 21/336*    (2006.01)
(52) U.S. Cl. ........................ 438/279; 438/283; 438/284; 438/286; 257/213; 257/347; 257/401; 257/E29.128
(58) Field of Classification Search ................. 438/151, 438/157, 197, 279–284, 286; 257/347, 213, 257/401, E29.128
See application file for complete search history.

(56) References Cited

U.S. PATENT DOCUMENTS 5,578,513 A * 11/1996 Maegawa .................... 438/151

6,664,582 B2    12/2003    Fried et al.
6,844,238 B2    1/2005    Yeo et al.
2005/0176186 A1*    8/2005    Lee et al. .................... 438/157

(Continued)

FOREIGN PATENT DOCUMENTS

JP    2005-229107    8/2005

OTHER PUBLICATIONS

Korean Office Action dated Nov. 10, 2006 for corresponding Korean Application No. 10-2005-0129138.

*Primary Examiner*—Ha Tran T Nguyen
*Assistant Examiner*—Daniel Whalen
(74) *Attorney, Agent, or Firm*—Harness, Dickey & Pierce, P.L.C.

(57) ABSTRACT

Example embodiments of the present invention relate to a semiconductor device and methods of fabricating the same. Other example embodiments of the present invention relate to a fin-field effect transistor (Fin-FET) having a fin-type channel region and methods of fabricating the same. A Fin-FET having a gate all around (GAA) structure that may use an entire area around a fin as a channel region is provided. The Fin-FET having the GAA structure includes a semiconductor substrate having a body, a pair of support pillars and a fin. The pair of support pillars may protrude from the body. A fin may be spaced apart from the body and may have ends connected to and supported by the pair of support pillars. A gate electrode may surround at least a portion of the fin of the semiconductor substrate. The gate electrode may be insulated from the semiconductor substrate. A gate insulation layer may be interposed between the gate electrode and the fin of the semiconductor substrate.

16 Claims, 10 Drawing Sheets

U.S. PATENT DOCUMENTS

2006/0172497 A1* 8/2006 Hareland et al. ............ 438/286
2006/0216897 A1* 9/2006 Lee et al. .................... 438/282
2007/0181959 A1* 8/2007 Park et al. ................... 257/401
2008/0017934 A1* 1/2008 Kim et al. ................... 257/401

* cited by examiner

FIN-FET HAVING GAA STRUCTURE AND METHODS OF FABRICATING THE SAME

PRIORITY STATEMENT

This application claims the benefit of priority under 35 U.S.C. § 119 from Korean Patent Application No. 10-2005-0129138, filed on Dec. 24, 2005, in the Korean Intellectual Property Office, the disclosure of which is incorporated herein in its entirety by reference.

BACKGROUND OF THE INVENTION

1. Field of the Invention

Example embodiments of the present invention relate to a semiconductor device and methods of fabricating the same. Other example embodiments of the present invention relate to a fin-field effect transistor (Fin-FET) having a fin-type channel region and methods of fabricating the same.

2. Description of the Related Art

As semiconductor devices become more highly integrated, design rules for components of semiconductor devices have become more stringent. For example, a gate length, which is a standard of the design rule, may decrease for semiconductor devices requiring more transistors. As the gate length decreases, a channel length may also decrease. A decrease in the channel length of a transistor may increase a short channel effect.

The short channel effect refers to a phenomenon wherein an effective channel length of a transistor decreases as a result of an effect of a drain potential and decreases in a threshold voltage. As the effective channel length of the transistor decreases, controlling the transistor becomes more difficult and an off current of the transistor increases, degrading the reliability of the transistor. For example, refresh characteristics of a memory device may also degrade.

Research of a fin-field effect transistor (Fin-FET), which is a transistor having a fin-channel structure using several surfaces of a thin fin as a channel, has been acknowledged by the conventional art. A short channel effect, which causes problems in a conventional planar transistor, may be prevented (or reduced) and simultaneously an operation current may increase.

For example, the conventional art discloses a Fin-FET and a fin memory cell. In the Fin-FET, top and side surfaces of a fin may be used as a channel region. The conventional art also acknowledges a Fin-FET wherein portions of side, upper and lower surfaces of a semiconductor fin may be used as a channel region.

Fabricating the Fin-FETs using an SOI substrate, may increase the manufacturing cost. Because a lower surface of a fin may not be entirely used as a channel region, the operating current may be limited.

SUMMARY OF THE INVENTION

Example embodiments of the present invention relate to a semiconductor device and methods of fabricating the same. Other example embodiments of the present invention relate to a fin-field effect transistor (Fin-FET) having a fin-type channel region and methods of fabricating the same.

According to yet other example embodiments of the present invention, there is provided a Fin-FET having a gate all around (GAA) structure. Other example embodiments of the present invention provide a Fin-FET having a GAA structure capable of using an entire area of a fin as a channel region.

Example embodiments of the present invention also provide a Fin-FET having a GAA structure using a bulk semiconductor substrate.

In the Fin-FET, a semiconductor substrate may include a body, a pair of support pillars protruding upward from the body and a first fin. The first fin may be spaced apart from the body and having ends connected to and supported by the pair of support pillars. A gate electrode may surround at least a part of the first fin of the semiconductor substrate. The gate electrode may be insulated from the semiconductor substrate. A gate insulation layer may be interposed between the gate electrode and the first fin of the semiconductor substrate.

Each of the support pillars may include a recessed region formed around the support pillar under a portion connected to the first fin of the semiconductor substrate.

The semiconductor substrate may further include a second fin protruding from the body. Ends of the second fin may be connected to the pair of support pillars and separately formed under the fin.

The gate insulation layer may be further formed on a surface of an upper end of the second fin. The gate electrode may be formed through the gate electrode. A portion of the gate electrode may be formed between the first fin and the second fin. As such, the gate electrode may be formed around a portion of the first fin and the second fin, hence, the gate all around (GAA) structure.

According to other example embodiments of the present invention, there is provided a method of fabricating a Fin-FET having a GAA structure. In the method, a semiconductor substrate may be selectively etched to form a pair of support pillars protruding upward from a body of the semiconductor substrate and a fin protruding upward from the body of the semiconductor substrate. Ends of the fin may be connected to and supported by the pair of support pillars.

A device insulation layer may be formed on the body of the semiconductor substrate exposing upper portions of the pair of support pillars and the fin of the semiconductor substrate. A spacer insulation layer may be formed on sidewalls of the pair of support pillars and the fin of the semiconductor substrate exposed from the device insulation layer. The device insulation layer may be etched to a desired thickness using the spacer insulation layer as an etching mask. Portions of the pair of support pillars and the fin of the semiconductor substrate may be exposed from the device insulation layer. The exposed portion of the semiconductor substrate may be removed to form a tunnel through the fin.

A gate insulation layer may be formed on a surface of the fin portion spaced apart from the body of the semiconductor substrate by the tunnel. A gate electrode may be formed on the device insulation layer. The gate electrode may surround a part of the fin portion of the semiconductor substrate on which the gate insulation layer has been formed.

According to example embodiments of the present invention, there is provided another method of fabricating a Fin-FET having a GAA structure. In the method, a semiconductor substrate may be selectively etched to form a pair of support pillars and a fin. The pair of support pillars may protrude upward from a body of the semiconductor substrate. The fin may protrude upward from the body of the semiconductor substrate, ends of the fin being connected to and supported by the pair of support pillars.

A device insulation layer may be formed on the body of the semiconductor substrate to expose upper portions of the pair of support pillars and the fin of the semiconductor substrate. The device insulation layer may be etched to a desired thickness using the spacer insulation layer as an etching mask.

Portions of the pair of support pillars and the fin of the semiconductor substrate may be exposed.

A tunnel, which transverses through the fin, may be formed by removing the exposed portion of the fin of the semiconductor substrate. Recessed regions may be formed on surfaces of the exposed portions of the pair of support pillars of the semiconductor substrate. The recessed regions may be formed after forming the tunnel or simultaneously with the tunnel. An insulation mask may be formed on the device insulation layer, the insulation mask including a trench exposing the tunnel and a fin portion spaced apart from the body of the semiconductor substrate by the tunnel. A gate insulation layer may be formed on the fin portion of the semiconductor substrate exposed by the trench of the insulation mask. A gate electrode may be formed on the device insulation layer, the gate electrode filling the trench of the insulation mask and surrounding a part of the fin portion spaced apart from the body of the semiconductor substrate.

BRIEF DESCRIPTION OF THE DRAWINGS

Example embodiments of the present invention will be more clearly understood from the following detailed description taken in conjunction with the accompanying drawings. FIGS. 1-19 represent non-limiting example embodiments of the present invention as described herein.

DETAILED DESCRIPTION OF THE INVENTION

Various example embodiments of the present invention will now be described more fully with reference to the accompanying drawings in which some example embodiments of the invention are shown. In the drawings, the thicknesses of layers and regions may be exaggerated for clarity.

Detailed illustrative embodiments of the present invention are disclosed herein. However, specific structural and functional details disclosed herein are merely representative for purposes of describing example embodiments of the present invention. This invention may, however, may be embodied in many alternate forms and should not be construed as limited to only the embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the scope of example embodiments of the present invention.

Spatially relative terms, such as "beneath", "below", "lower", "above", "upper" and the like, may be used herein for ease of description to describe one element or a feature's relationship to another element or feature as illustrated in the Figures. It will be understood that the spatially relative terms are intended to encompass different orientations of the device in use or operation in addition to the orientation depicted in the Figures. For example, if the device in the Figures is turned over, elements described as "below" or "beneath" other elements or features would then be oriented "above" the other elements or features. Thus, for example, the term "below" can encompass both an orientation which is above as well as below. The device may be otherwise oriented (rotated 90 degrees or viewed or referenced at other orientations) and the spatially relative descriptors used herein should be interpreted accordingly.

Example embodiments of the present invention are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments of the invention should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope of the present invention.

It should also be noted that in some alternative implementations, the functions/acts noted may occur out of the order noted in the FIGS. For example, two FIGS. shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments of the present invention belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In order to more specifically describe example embodiments of the present invention, various aspects of the present invention will be described in detail with reference to the attached drawings. However, the present invention is not limited to the example embodiments described.

Example embodiments of the present invention relate to a semiconductor device and methods of fabricating the same. Other example embodiments of the present invention relate to a fin-field effect transistor (Fin-FET) having a fin-type channel region and methods of fabricating the same.

In the example embodiments of the present invention, a fin-type field effect transistor (Fin-FET) uses a surface of a fin as a channel region. For example, the Fin-FET may be used in a logic device or a memory device requiring the high-speed operation.

Figure 1:
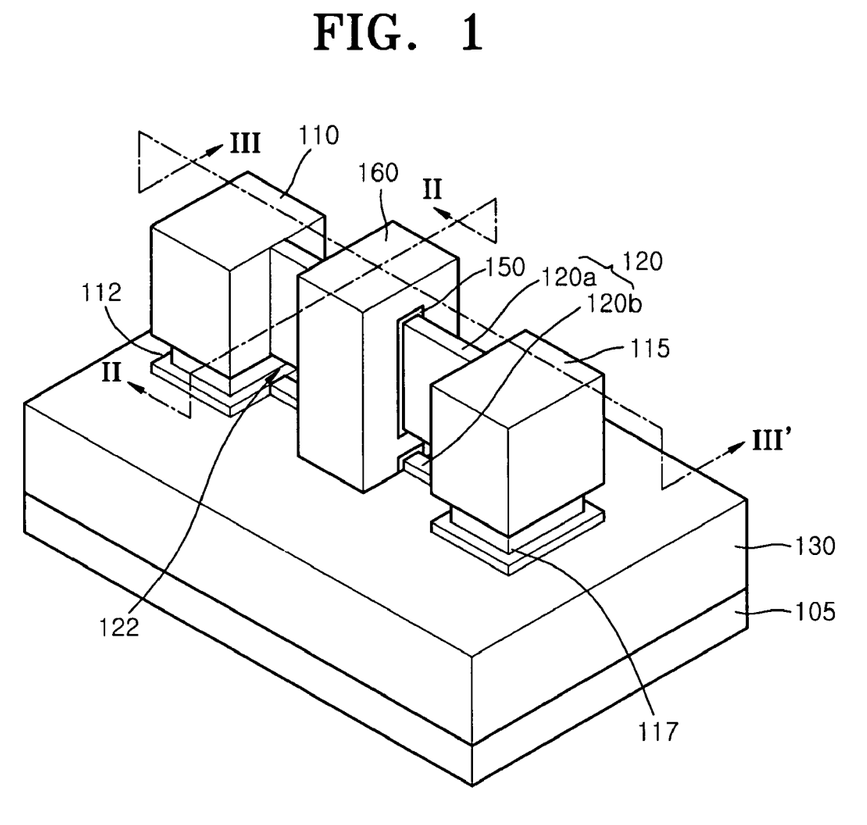
FIG. 1 is a diagram illustrating a perspective view of a Fin-FET according to example embodiments of the present invention.
Figure 2:
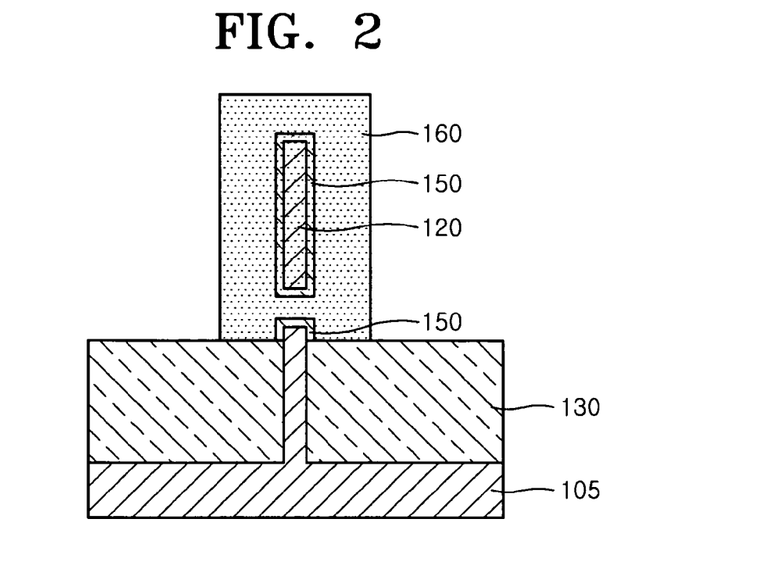
FIG. 2 is a diagram illustrating a cross-sectional view taken along line II-II' of FIG. 1.
Figure 3:
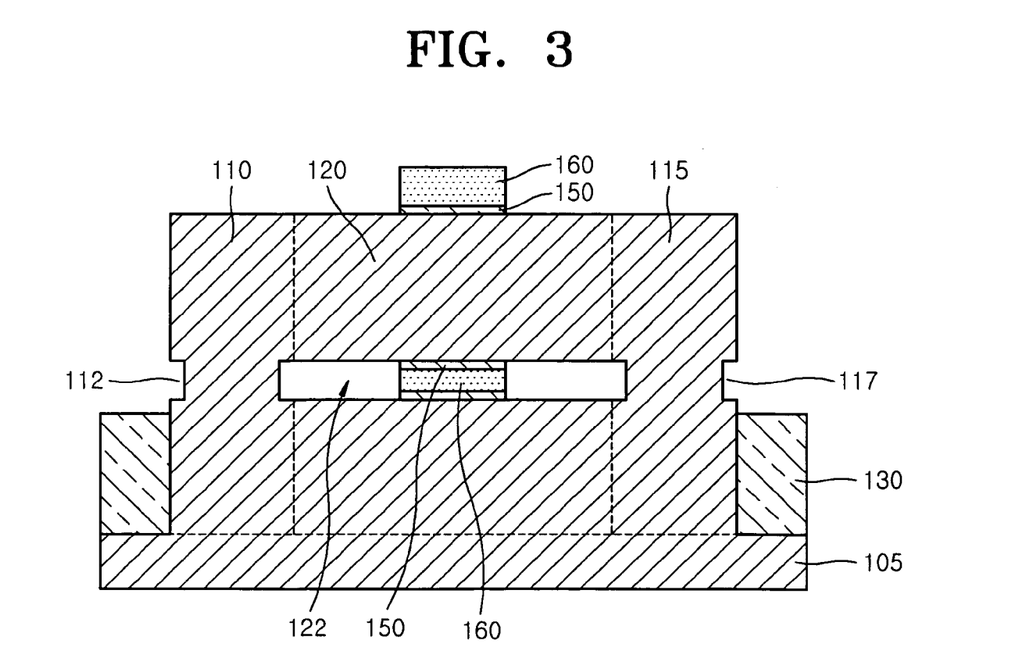
FIG. 3 is a diagram illustrating a cross-sectional view taken along line III-III' of FIG. 1.

FIG. 1 is a diagram illustrating a perspective view of a Fin-FET according to example embodiments of the present invention. FIG. 2 is a diagram illustrating a cross-sectional view taken along line II-II' of FIG. 1. FIG. 3 is a diagram illustrating a cross-sectional view taken along line III-III' of FIG. 1.

Referring to FIGS. 1 through 3, the Fin-FET includes a semiconductor substrate having a body 105, a pair of support pillars 110 and 115, and a fin 120. The semiconductor substrate may be a bulk wafer. The body 105, the support pillars 110 and 115 and the fin 120 may be formed of the same semiconductor material. For example, the semiconductor substrate may be a bulk silicon wafer or a bulk silicon-germanium wafer doped with impurities.

The support pillars 110 and 115 may individually protrude from the body 105 in an upward direction. The fin 120 may include an upper portion 120*a* and a lower portion 120*b* separated from each other by a tunnel 122. The upper portion 120*a* of the fin 120 may be spaced apart from the body 105 by the tunnel 122. Ends of the fin 120 may be connected to and supported by the support pillars 110 and 115. The lower portion 120*b* of the fin 120 may protrude from the body 105 and ends thereof may be supported by the support pillars 110 and 115. The upper portion 120*a* and the lower portion 120*b* of the fin 120 may be formed on the same cross section. For example, the fin 120 may be formed as one plate and then be divided into the upper portion 120*a* and the lower portion 120*b* by the tunnel 122.

The height of the tunnel 122 may decrease toward the inside (or middle) of the fin 120. As shown in FIGS. 1 through 3, the height of the tunnel 120 may be constant. The support pillars 110 and 115 may include recessed regions 112 and 117 formed around the support pillar 110 and 115, near the tunnel 122 under the upper portion 120*a* of the fin 120. The width of the support pillars 110 and 115 in the recessed regions 112 and 117 may be smaller than that at other portions of the support pillars 110 and 115.

A device insulation layer 130 may be formed on the body 105 to surround portions of the support pillars 110 and 115 and the lower portion 120*b* of the fin 120. For example, the device insulation layer 130 may expose the recessed regions 112 and 117 of the support pillars 110 and 115 and expose an upper end of the lower portion 120*b* of the fin 120. The device insulation layer 130 may be interposed between a gate electrode 160 and the body 105. The device insulation layer 130 may insulate the gate electrode 160 from the body 105. For example, the device insulation layer 130 may be formed of an oxide layer.

The gate electrode 160 may surround at least a part of the upper portion 120*a* of the fin 120. The gate electrode 160 may be insulated from the semiconductor substrate. The gate electrode 160 may be insulated from the body 105 and the fin 120. The gate electrode 160 may have a gate all around (GAA) structure. A surface side of the upper portion 120*a* of the fin 120, which may be surrounded by the gate electrode 160, may be used as a channel region of the Fin-FET. For example, the gate electrode 106 may be formed of a polysilicon layer, a metal layer, a metal silicide layer or a combination thereof.

Because the GAA structure uses not only a side surface of the upper portion 120*a* of the fin 120 but also its upper and lower portions as a channel region, it may increase an operating current and performance of the Fin-FET. The gate electrode 160 may be further formed on an upper end surface of the lower portion 120*b* of the fin 120. For example, the upper portion 120*a* and the lower portion 120*b* of the fin 120 may be formed through the gate electrode 160. A portion of the gate electrode 160 may be formed between the upper portion 120*a* and the lower portion 120*b* of the fin 120. The operating current of the Fin-FET may increase even more.

A gate insulation layer 150 may be interposed between the gate electrode 160 and the upper portion 120*a* of the fin 120. For example, the gate insulation layer 150 may be formed on a surface of the upper portion 120*a* of the fin 120 under the gate electrode 160. The gate insulation layer 150 may be formed on a surface of an upper end of the lower portion 120*b* of the fin 120 exposed from the device insulation layer 130. The gate insulation layer 150 may insulate the gate electrode 160 from the fin 120. For example, the gate insulation layer 150 may include an oxide layer or a high dielectric constant insulation layer.

Fin regions disposed on sides of the gate electrode 160 may be used as a source region (not shown) and a drain region (not shown) of the Fin-FET, respectively. The source region and the drain region may further extend to the support pillars 110 and 115, respectively. For example, the source region and the drain region may be doped with the same type of impurities. The source region and the drain region may be diode-connected to the body 105.

Although the gate electrode 160 is illustrated to surround an exposed portion of the fin 120 in FIGS. 1 through 3, the gate electrode 160 may also be formed to surround an entire exposed portion of the fin 120. The source region and the drain region may be formed at the support pillars 110 and 115.

The aforementioned Fin-FET according to example embodiments of the present invention has a GAA structure. In other words, the gate electrode 160 may be formed to surround the entire upper portion 120a of the fin 120. As such, a channel region may be formed around a surface of the upper portion 120a of the fin 120. Accordingly, as compared to the conventional art that uses only a portion of a surface as a channel region, the Fin-FET according to example embodiments of the present invention may increase an operating current, increasing performance.

FIGS. 4 through 11 are diagrams illustrating cross-sectional views of a method of fabricating the Fin-FET having the GAA structure according to example embodiments of the present invention. The method of fabricating the Fin-FET will be described below with reference to the Fin-FET structure of FIGS. 1 through 3. Like reference numerals denote like elements throughout the embodiments of the present invention.

Figure 4:
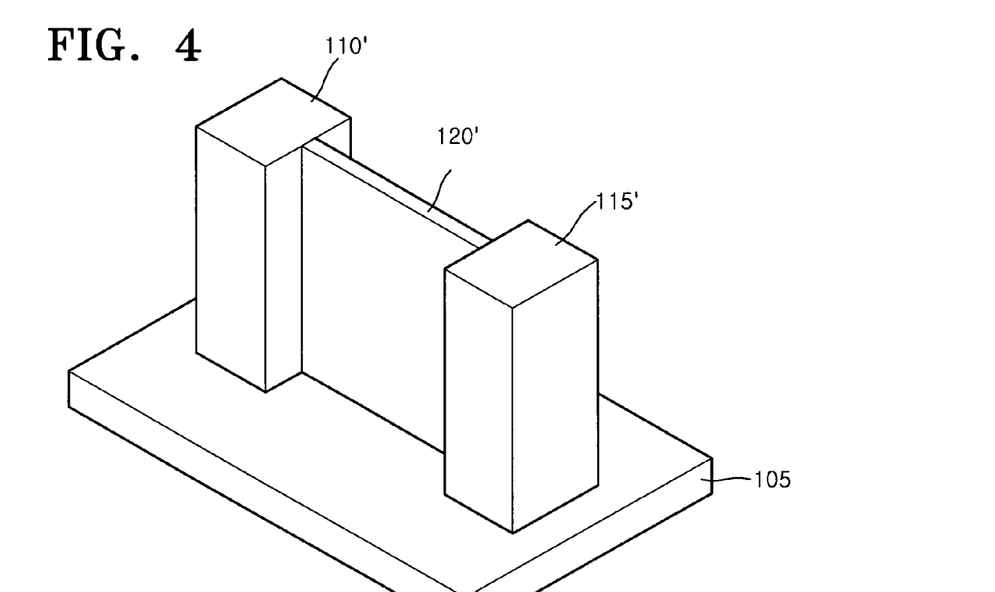
FIGS. 4 through 11 are diagrams illustrating perspective views of a method of fabricating a Fin-FET according to example embodiments of the present invention.

Referring to FIG. 4, a semiconductor substrate may be selectively etched to form a pair of support pillars 110' and 115' and a fin 120' such that each has a top portion protruding from a body 105. Ends of the fin 120' may be connected to and supported by the support pillars 110' and 115'. The semiconductor substrate may be a bulk semiconductor wafer example (e.g., a silicon wafer or a silicon-germanium wafer). The body 105, the support pillars 110' and 115' and the fin 120 may be formed of the same material. As such, the support pillars 110' and 115' and the fin 120 may be a portion of the semiconductor substrate.

The support pillars 110' and 115' and the fin 120' may be formed according to the conventional art. For example, mask patterns for exposing support pillars 110' and 115' and a fin 120' may be formed on a semiconductor substrate. Using the mask patterns as an etching mask, the semiconductor substrate may be etched to a desired depth to form the support pillars 110' and 115' and the fin 120'. Spacer-type mask patterns may be used to more precisely control a width of the fin 120'. For example, the support pillars 110' and 115 and the fin 120' may be separately formed.

Figure 5:
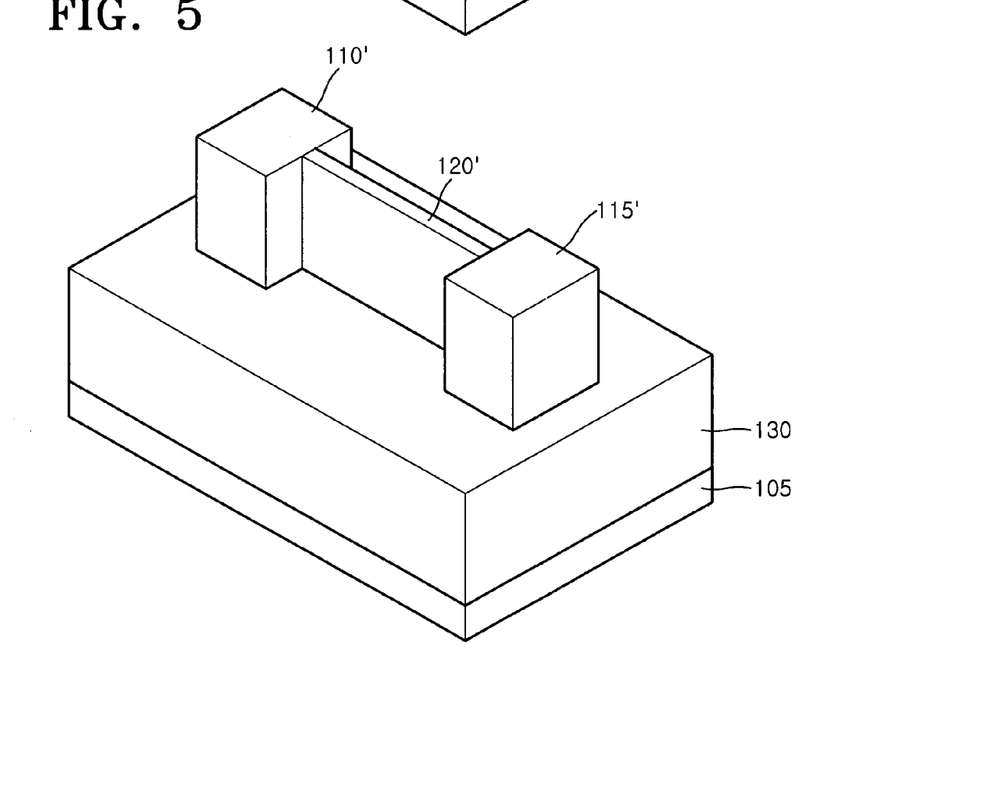

Referring to FIG. 5, a device insulation layer 130 may be formed on the body 105 to expose upper portions of the support pillars 110' and 115' and the fin 120'. For example, a device insulation film (not shown) may be formed on the resulting structure of FIG. 4 by a chemical vapor deposition (CVD) process. The device insulation film may be planarized and etched to a desired thickness, forming the device insulation layer 130. The device insulation layer 130 may be formed of an oxide layer.

Figure 6:
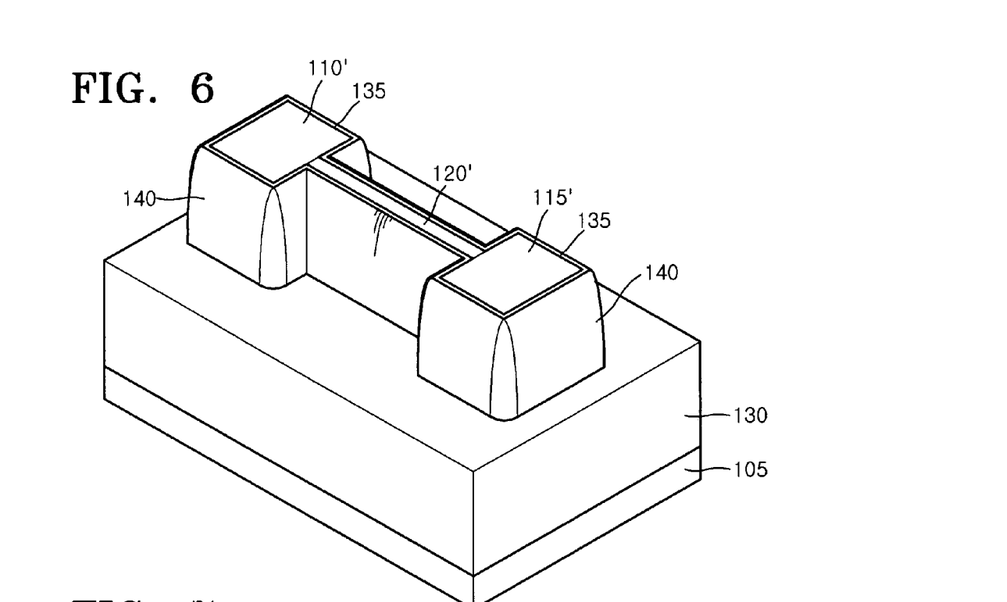

Referring to FIG. 6, a buffer insulation layer 135 and a spacer insulation layer 140 may be sequentially formed on sidewalls of the support pillars 110' and 115' and the fin 120' exposed from the device insulation layer 130. The buffer insulation layer 135 may reduce the stress of the spacer insulation layer 140. The buffer insulation layer 135 may be omitted in other example embodiments of the present invention. The buffer insulation layer 135 may be formed of an oxide layer.

The spacer insulation layer 140 may be formed of a nitride layer. The formation of the spacer insulation layer 140 may include forming a spacer insulation film (not shown) and anisotropically etching the spacer insulation film. The spacer insulation layer 140 may have an etch selectivity with respect to the device insulation layer 130.

Figure 7:
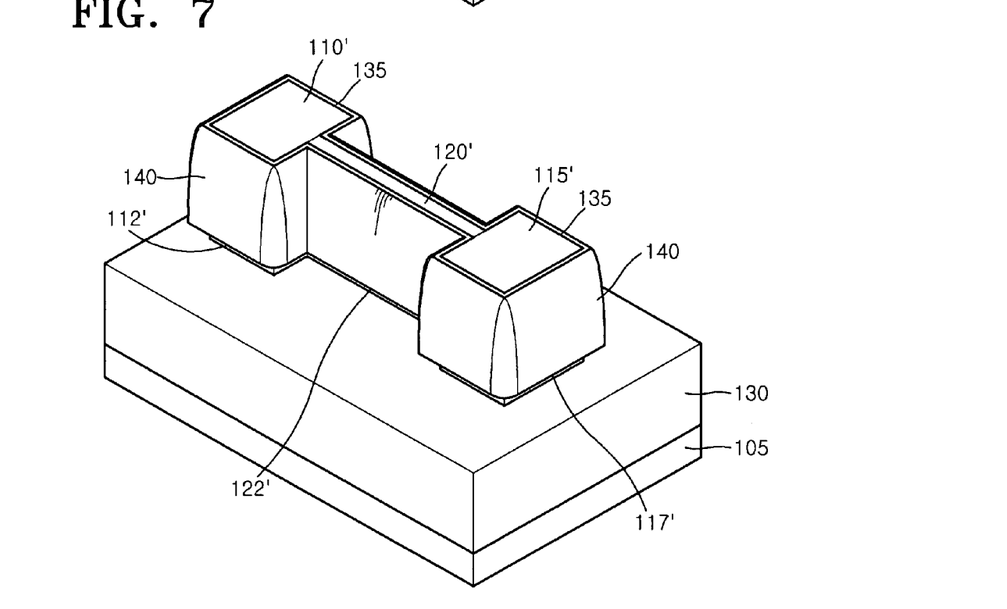

Referring to FIG. 7, the device insulation layer 130 may be etched to a desired thickness by using the spacer insulation layer 140 as an etching mask. As such, intermediate portions 112' and 117' of the support pillars 110' and 115' and an intermediate portion 122' of the fin 120' under the spacer insulation layer 140 may be exposed from the device insulation layer 130. For example, the device insulation layer 130 may be etched to a desired thickness by isotropic wet etching. The exposed intermediate portion 122' of the fin 120' may define a portion where a tunnel 122 (shown in FIG. 9) will be formed. The etching time may be controlled according to a height of the tunnel 122.

Figure 8:
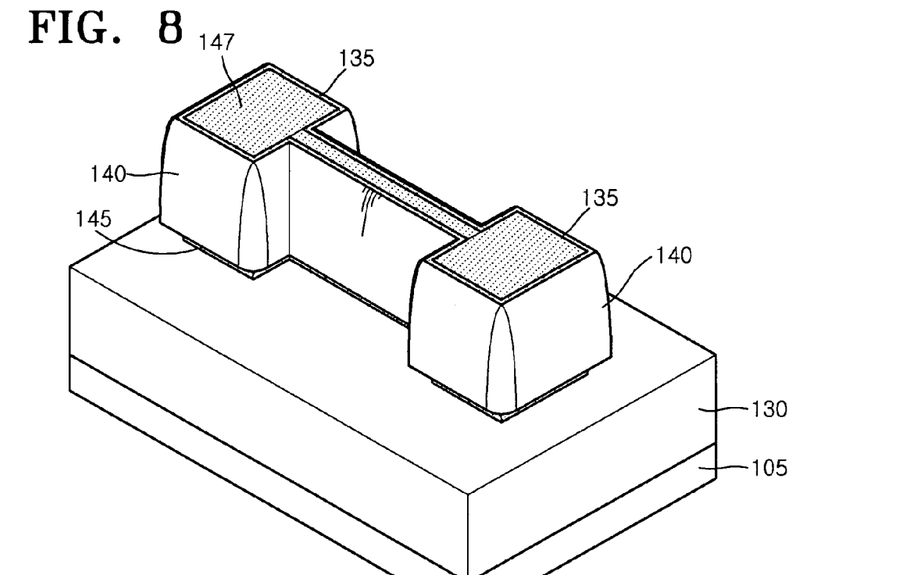

Referring to FIG. 8, a sacrificial oxide layer 145 may be formed by oxidizing surfaces of the intermediate portions 112' and 117' of the support pillars 110' and 115' and the intermediate portion 122' of the fin 120'. Another sacrificial oxide layer 147 may be simultaneously formed on surface portions of the support pillars 110' and 115' and the fin 120' exposed from the spacer insulation layer 140. For example, the portions of the support pillars 110' and 115' and the fin 120' exposed from the spacer insulation layer 140 and the device insulation layer 130 may be oxidized.

In the oxidation process, the intermediate portion 122' of the fin 120' may be oxidized over an entire width of the fin 120'. The thickness of the sacrificial oxide layer 145 formed at the intermediate portion 122' of the fin 120' may not be constant in the width direction. For example, if the oxidation is performed for a shorter period of time, the sacrificial oxide layer 145 may be thinner toward the inside (or middle) of the intermediate portion 122' of the fin 120' from a surface of the fin 120'. The sacrificial oxide layer 145 of the intermediate portion 122' of the fin 120' may be made to have a constant thickness in the width direction by maintaining oxidation for a sufficient period of time. Because the height of the fin 120' is sufficiently larger than the width, another sacrificial oxide layer 147 may be formed only at a surface side of an upper portion of the fin 120'.

Because the support pillars 110' and 115' have the relatively lager width than that of the fin 120', the sacrificial oxide layers 145 and 147 may be formed only on a surface portion. The oxidation time may be controlled in order that the intermediate portion 122' of the fin 120' may be completely oxidized in the width direction and only the surfaces of the intermediate portions 112' and 117' of the support pillars 110' and 115' may be oxidized.

Figure 9:
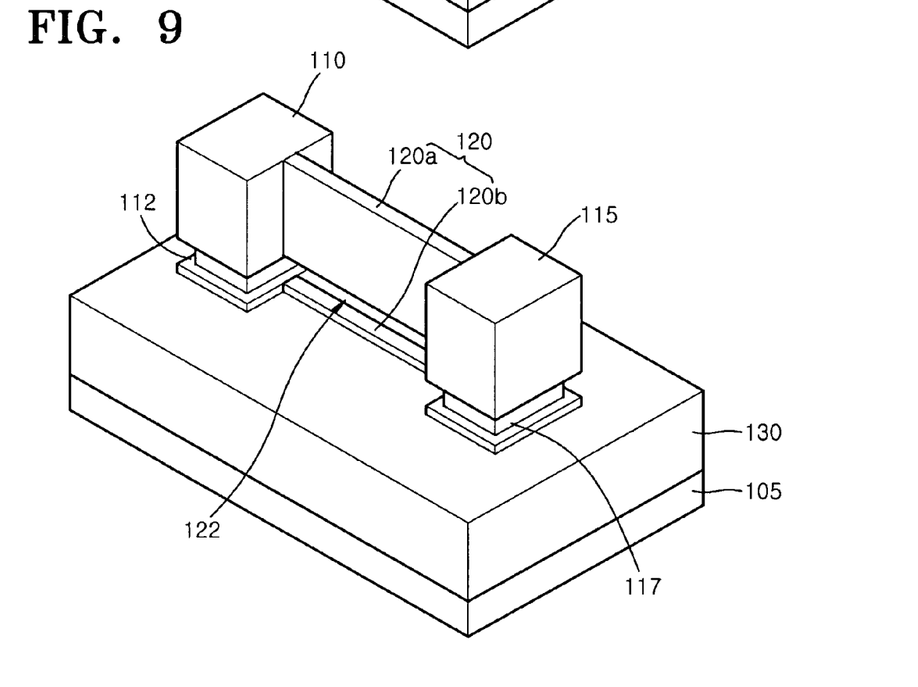

Referring to FIG. 9, the sacrificial oxide layers 145 and 147 (shown in FIG. 8), the buffer insulation layer 135 and the spacer insulation layer 140 may be removed to form support pillars 110 and 115 having recessed regions 112 and 117 and a fin 120 having a tunnel 122. The fin 120 may be divided into an upper portion 120a and a lower portion 120b. While the upper portion 120a may be spaced apart from the lower portion 120b by the tunnel 122, ends of the upper portion 120a may be supported by the support pillars 110 and 115.

The shapes of the recessed regions 112 and 117 and the tunnel 122 may be determined by the shape of the sacrificial oxide layer 145. The tunnel 122 may have a substantially constant width or may have a width decreasing toward the inside (or middle) of the fin 120.

For example, the sacrificial oxide layers 145 and 147, the buffer insulation layer 135 and the spacer insulation layer 140 may be removed by wet etching. The sacrificial oxide layers 145 and 147 and the buffer insulation layer 135 may be removed using a wet etching solution including hydrofluoric acid. The spacer insulation layer 140 may be removed using a wet etching solution including phosphoric acid. When the sacrificial oxide layers 145 and 147 and the buffer insulation layer 135 are removed, a portion of the device insulation layer 130 may also be etched. An upper end of the lower portion 120b of the fin 120 may be exposed from the device insulation layer 130.

In example embodiments of the present invention, the method of forming the sacrificial oxide layers 145 and 147 of FIG. 8 may be omitted. The removal method of FIG. 9 may be modified. For example, exposed intermediate portions 112' an 117' of the support pillars 110' and 115' and an exposed intermediate portion 122' of the fin 120' may be etched using the spacer insulation layer 140 and the device insulation layer 135 as an etching mask in order that recessed portions 112 and 117 and a tunnel 122 may be formed. Upper end surfaces of the support pillars 110' and 115 and the fin 120' exposed from the spacer insulation layer 140 may be partially etched.

Figure 10:
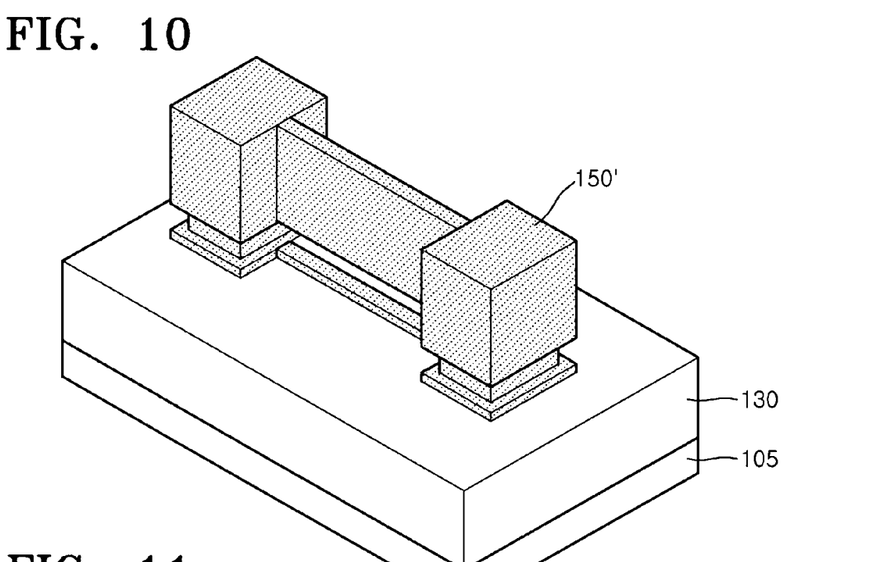

Referring to FIG. 10, a gate insulation film 150' may be formed on a surface of the support pillars 110 and 115 (shown in FIG. 9) and the fin 120 exposed by the device insulation layer 130. The gate insulation layer 150' may be formed using a thermal oxidation method or a CVD method. When the thermal oxidation method is used, the exposed surfaces of the support pillars 110 and 115 and the fin 120 may be oxidized.

Figure 11:
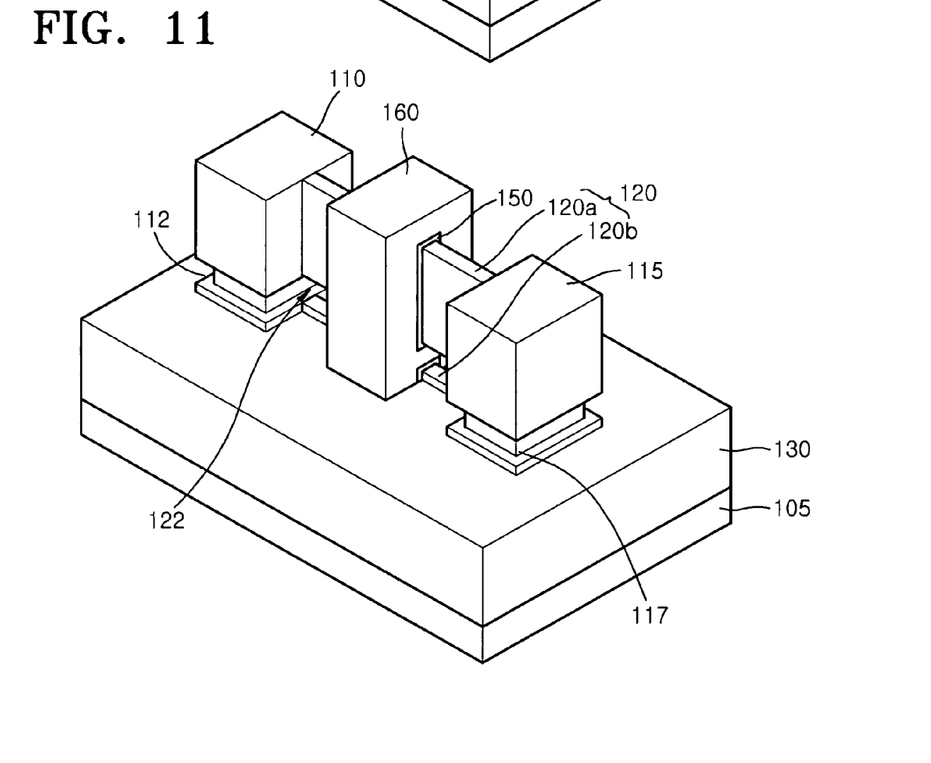

Referring to FIG. 11, a gate electrode layer (not shown) may be formed on an entire surface of a resulting structure where the gate insulation film 150' of FIG. 10 has been formed. The gate insulation film 150' and the gate electrode layer may be patterned to form a gate insulation layer 150 and a gate electrode 160, respectively. The gate insulation layer 150 may be formed on a surface of an upper portion 120a of the fin 120 spaced apart from the body 105 by the tunnel 122. The gate insulation layer 150 may also be formed on a surface of an upper end of a lower portion 120b exposed from the device insulation layer 130.

The gate electrode 160 may be formed on the device insulation layer 130 to surround an entire part of the upper portion 120a of the fin 120 where the gate insulation layer 150 is formed. Also, the gate electrode 160 may be further formed on an upper end of the lower portion 120a of the fin 120. The gate electrode 160 may be insulated from the fin 120 by the gate insulation layer 150. The gate electrode 160 may be insulated from the body 105 by the device insulation layer 130. For example, the gate electrode 160 may be insulated from the semiconductor substrate.

A source region (not shown) and a drain region (not shown) may be formed by doping impurities into the fin portion located on sides of the gate electrode 160 and the support pillars 110 and 115. Metal interconnections may be formed using methods which are well-known to those skilled in the art.

According to example embodiments of the present invention, a Fin-FET may be fabricated to have a GAA structure by using a bulk semiconductor substrate. The method of fabricating a Fin-FET with a GAA structure according to example embodiments of the present invention may decrease fabrication cost compared to a conventional fabrication method using an SOI wafer or an epi layer.

FIGS. 12 through 19 are diagrams illustrating a method of fabricating a Fin-FET having a GAA structure according to example embodiments of the present invention. Other example embodiments of the present invention provide modified methods of forming a gate insulation layer and a gate electrode. The embodiment of FIGS. 4 through 9 may be used as reference for a method of forming support pillars 110 and 115 and a fin 120 according to example embodiments of the present invention. Like reference numerals in the example embodiments denote like elements.

Figure 12:
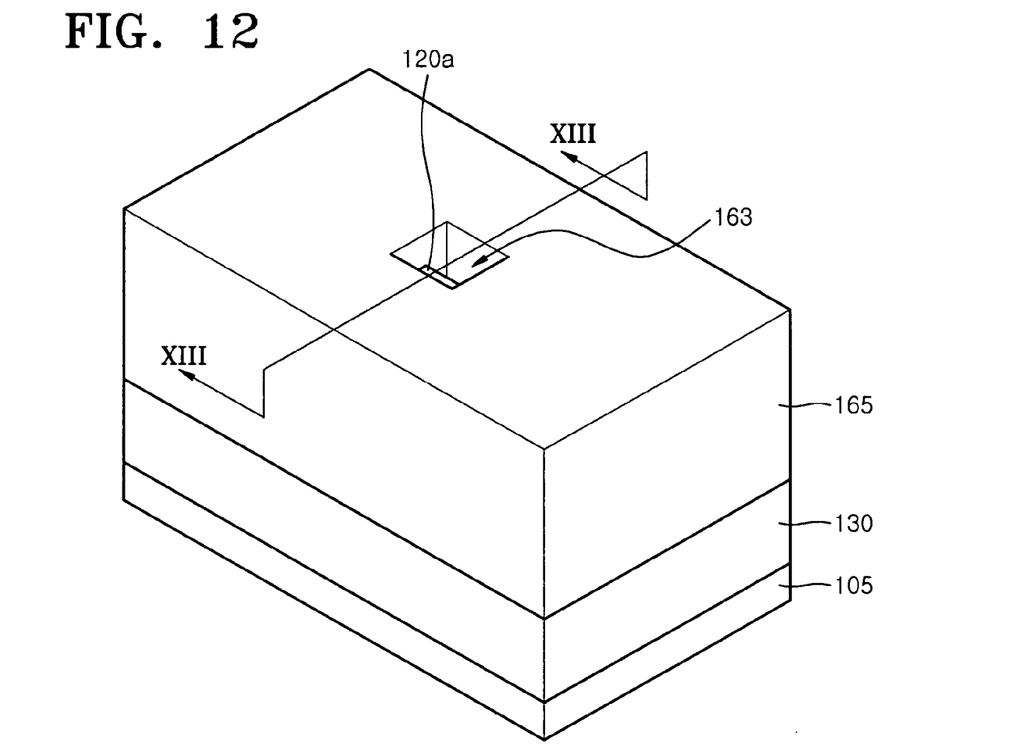
FIGS. 12, 14, 16 and 18 are diagrams illustrating perspective views of a method of fabricating a Fin-FET according to example embodiments of the present invention.
Figure 13:
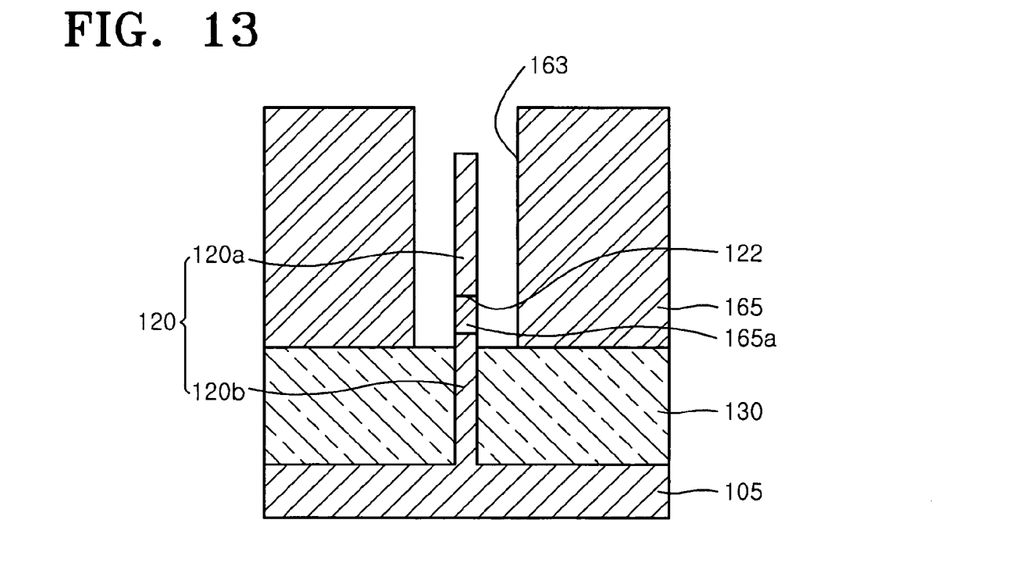
FIGS. 13, 15, 17 and 19 are diagrams illustrating cross-sectional views of structures of FIGS. 12, 14, 16 and 18, respectively.

Referring to FIGS. 12 and 13, an insulation mask 165 including a trench 163 exposing a portion of a fin 120 may be formed on a device insulation layer 130. For example, an insulation mask layer (not shown) surrounding the fin 120 may be formed on the device insulation layer 130. An insulation mask layer may be anisotropically etched to form a trench 163 exposing a portion of the fin 120. For example, the insulation mask 165 may be formed of an oxide layer. The trench 163 may expose an upper portion 120a of the fin 120 having a desired length. The trench 163 may expose an upper end surface of the lower portion 120b. A portion 165a of the insulation mask layer may remain inside the tunnel 122, between the upper portion 120a and the lower portion 120b of the fin 120.

Figure 14:
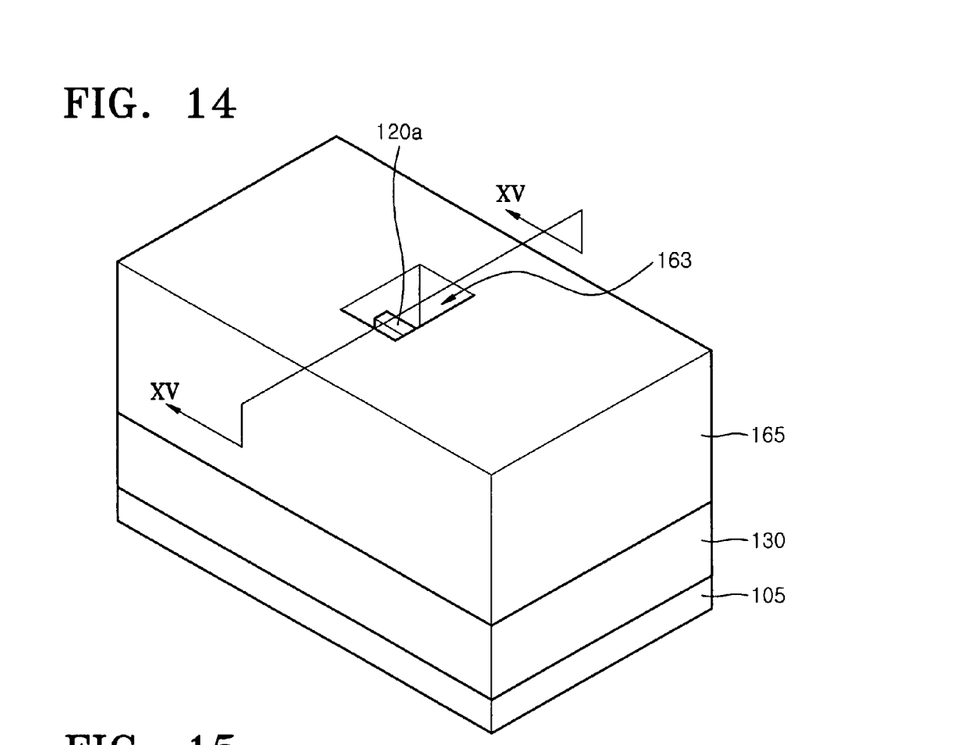
Figure 15:
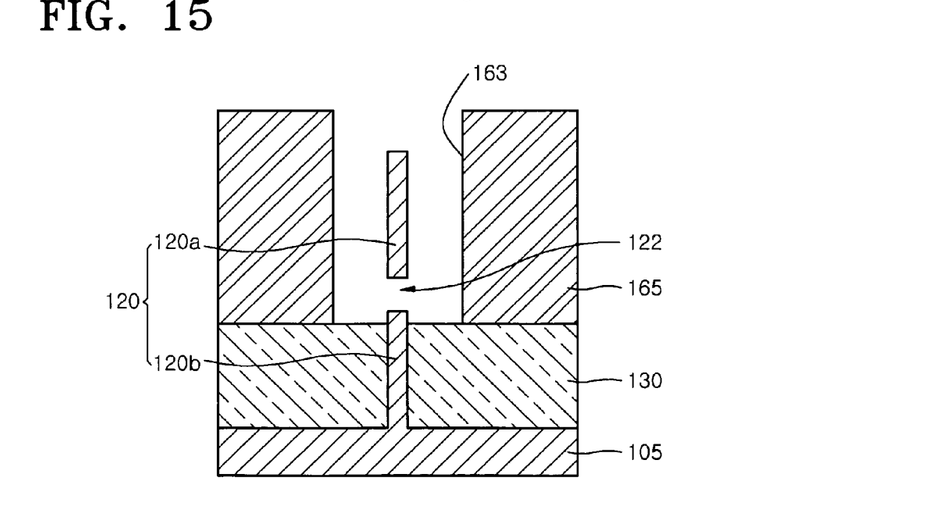

Referring to FIGS. 14 and 15, the insulation mask 165 may be isotropically etched to expand a width of the trench 163. The portion 165a of the insulation mask layer may be removed to open the tunnel 122. The expanding and opening operations may be performed by wet etching.

Figure 16:
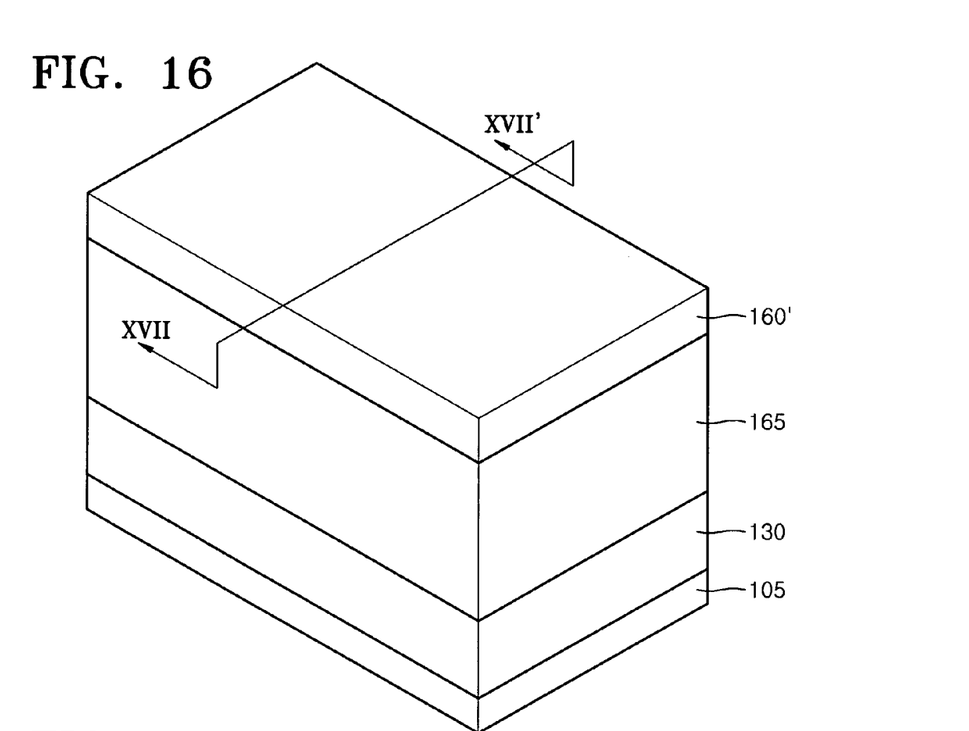
Figure 17:
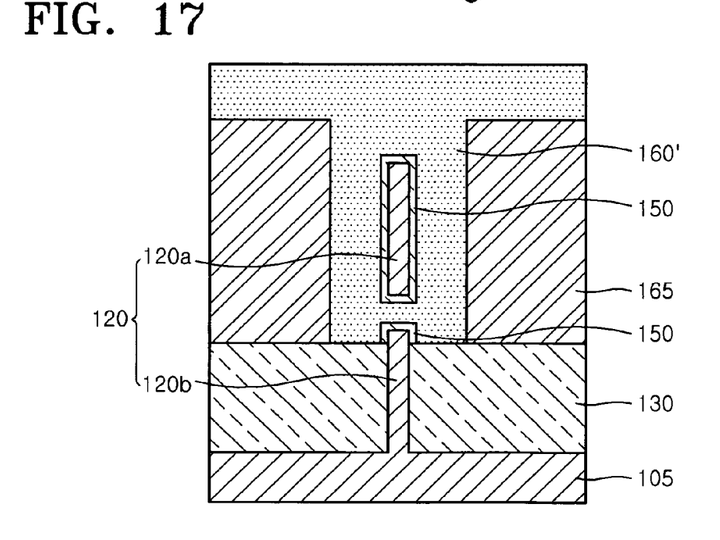

Referring to FIGS. 16 and 17, a gate insulation layer 150 may be formed on a surface of a portion of the fin 120 exposed by the trench 163 of FIG. 14. The gate insulation layer 150 may be formed on a surface of the upper portion 120a of the fin 120. The gate insulation layer 150 may be formed on an upper surface of the lower portion 120b of the fin 120. The gate insulation layer 150 may be formed by a thermal oxidation method or a CVD method.

A gate electrode layer 160, which fills the trench 163 and protrudes above the insulation mask 165, may be formed on a resulting structure where the gate insulation layer 150 has been formed. The gate electrode layer 160 may be formed of a polysilicon layer, a metal layer, a metal silicide layer or a combination thereof by a CVD method.

Figure 18:
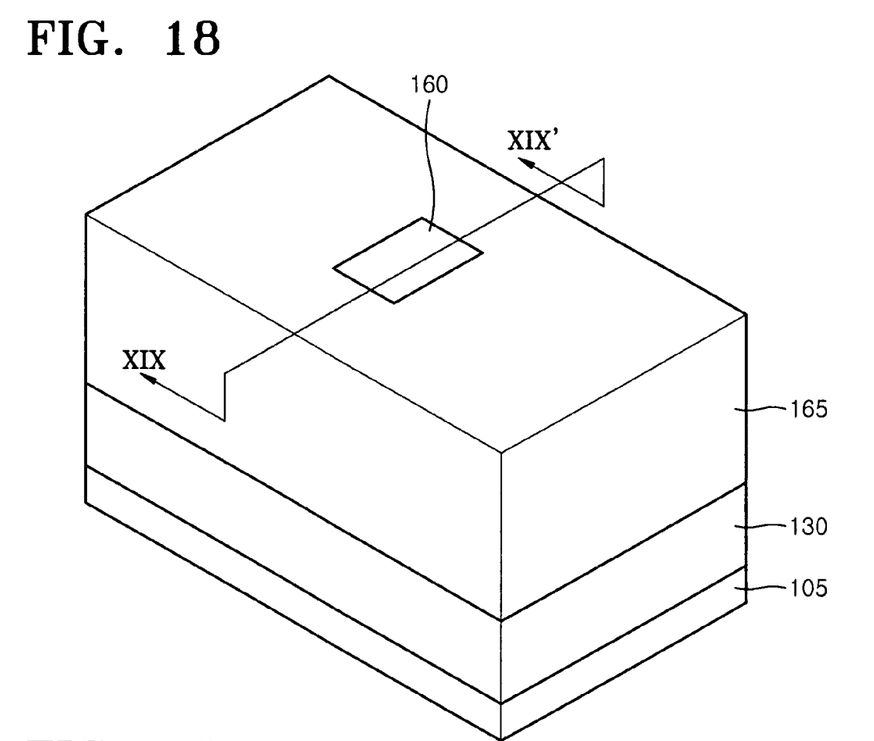
Figure 19:
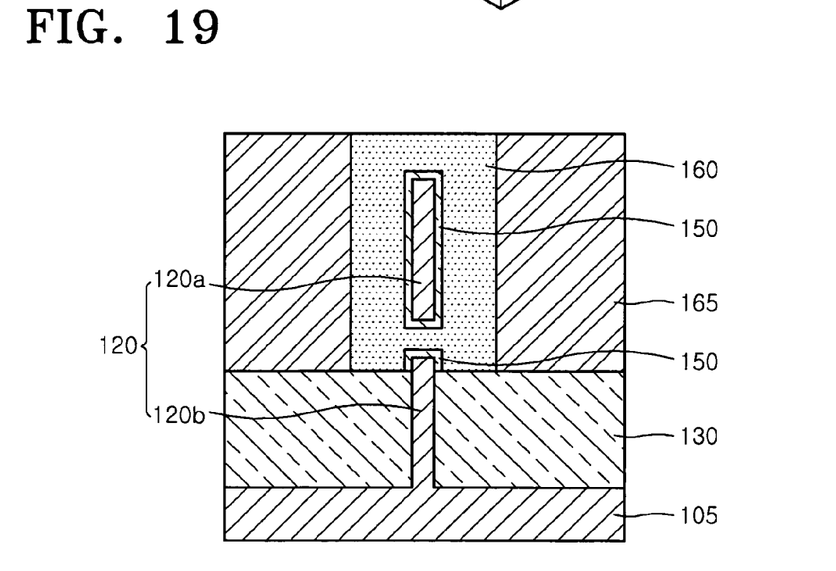

Referring to FIGS. 18 and 19, the gate electrode layer 160 may be planarized until the insulation mask 165 is exposed, forming a gate electrode 160 filled in the trench 163 of FIG. 14. The gate electrode 160 may entirely surround a part of the upper portion 120a of the fin 120. The gate electrode 160 may be formed on an upper end surface of the lower portion 120b and the device insulation layer 130.

According to the example embodiments of the present invention, the Fin-FET may be fabricated to have a GAA structure by using a bulk semiconductor substrate. The method of fabricating the Fin-FET having the GAA structure according to the example embodiments of the present invention may lower a fabrication cost as compared to a conventional fabrication method using an SOI wafer or an epi layer.

The foregoing is illustrative of the example embodiments of the present invention and is not to be construed as limiting thereof. Although a few example embodiments of the present invention have been described, those skilled in the art will readily appreciate that many modifications are possible in the example embodiments without materially departing from the novel teachings and advantages of the present invention. Accordingly, all such modifications are intended to be included within the scope of this invention as defined in the claims. In the claims, means-plus-function clauses are intended to cover the structures described herein as performing the recited function, and not only structural equivalents but also equivalent structures. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The present invention is defined by the following claims, with equivalents of the claims to be included therein.

What is claimed is:

1. A method of fabricating a fin-field effect transistor (Fin-FET) having a gate all around (GAA) structure, the method comprising:

selectively etching a semiconductor substrate to form a pair of support pillars protruding from a body of the semiconductor substrate and a fin protruding from the body, wherein ends of the fin are connected to and supported by the pair of support pillars;

forming a device insulation layer on the body to expose top portions of the pair of support pillars and the fin;

forming a spacer insulation layer on side walls of the exposed top portions of the pair of support pillars and the fin;

etching the device insulation layer to a desired thickness using the spacer insulation layer as an etching mask to expose intermediate portions of the pair of support pillars and the fin;

forming a tunnel through the fin by removing the exposed intermediate portion of the fin;

forming a gate insulation layer on a surface of an upper portion of the fin spaced apart from the body by the tunnel; and forming a gate electrode on the device insulation layer, the gate electrode surrounding a part of the upper portion of the fin.

2. The method of claim 1, further comprising forming a recessed region by etching the exposed intermediate portions of the pair of support pillars, simultaneously with forming the tunnel.

3. The method of claim 2, wherein forming the tunnel and forming the recessed region includes:

oxidizing surfaces of the exposed intermediate portions of the pair of support pillars and the fin; and removing oxidized portions of the pair of support pillars and the fin.

4. The method of claim 2, wherein forming the tunnel and forming the recessed region includes etching surfaces of the exposed intermediate portions of the pair of support pillars and the fin.

5. The method of claim 1, wherein forming the gate electrode includes:

forming a gate electrode layer surrounding the fin on an entire surface of the Fin-FET, after forming the gate insulation layer; and patterning the gate electrode layer to form the gate electrode surrounding the part of the upper portion of the fin.

6. The method of claim 5, wherein the gate insulation layer is formed on an exposed surface of a lower portion of the fin, the lower portion connecting the fin under the tunnel to the body.

7. The method of claim 6, wherein the gate insulation layer is formed by thermal oxidation.

8. The method of claim 6, wherein the gate electrode is formed on the gate insulation layer.

9. The method of claim 1, further comprising:

forming recessed regions on surfaces of the exposed intermediate portions of the pair of support pillars, after or simultaneously forming the tunnel; and forming an insulation mask on the device insulation layer, the insulation mask having a trench that exposes the tunnel and the upper portion of the fin spaced apart from the body by the tunnel, prior to forming the gate insulation layer;

wherein the gate insulation layer is formed on the upper portion of the fin exposed by the trench, and the gate electrode fills the trench.

10. The method of claim 9, wherein forming the insulation mask having the tunnel and forming the recessed region includes:

oxidizing surfaces of the exposed intermediate portions of the pair of support pillars and the fin; and removing oxidized portions of the pair of support pillars and the fin.

11. The method of claim 9, wherein forming the insulation mask having the exposed tunnel and forming the recessed region includes etching surfaces of the exposed intermediate portions of the pair of support pillars and the fin.

12. The method of claim 9, wherein the trench exposes a surface of a lower portion of the fin, the lower portion connecting the fin under the tunnel to the body.

13. The method of claim 12, wherein the gate insulation layer is formed on the exposed surface of the lower fin portion of the fin.

14. The method of claim 13, wherein the gate electrode is formed on the gate insulation layer on the lower portion of the fin.

15. The method of claim 9, wherein forming the insulation mask includes:

forming an insulation mask film on the device insulation layer, the insulation mask film covering the pair of support pillars and the fin; and etching the insulation mask film to form the trench.

16. The method of claim 15, wherein the etching the insulation mask film includes anisotropic etching to form the trench, and isotropic etching to expand the trench and to remove the insulation mask film formed in the tunnel.

* * * * *